United States Patent
Kobayashi

(10) Patent No.: US 8,164,394 B2
(45) Date of Patent: Apr. 24, 2012

(54) MODULATION APPARATUS AND TEST APPARATUS

(75) Inventor: Norio Kobayashi, Gunma (JP)

(73) Assignee: Advantest Corporation, Tokyo (JP)

( * ) Notice: Subject to any disclaimer, the term of this patent is extended or adjusted under 35 U.S.C. 154(b) by 30 days.

(21) Appl. No.: 12/849,608

(22) Filed: Aug. 3, 2010

(65) Prior Publication Data

US 2011/0084750 A1 Apr. 14, 2011

(30) Foreign Application Priority Data

Oct. 14, 2009 (JP) ................................ 2009-237773

(51) Int. Cl.
*G01R 31/00* (2006.01)
*H03C 3/00* (2006.01)
(52) U.S. Cl. .................................. 332/103; 324/750.01
(58) Field of Classification Search .......... 332/103–105; 327/231, 237, 238, 254, 255; 324/500, 511, 324/537, 750.01, 762.01, 762.02, 762.06
See application file for complete search history.

(56) References Cited

U.S. PATENT DOCUMENTS

| 5,124,656 | A * | 6/1992 | Yassa et al. | 327/155 |
| 6,188,261 | B1 * | 2/2001 | Nosaka et al. | 327/261 |

FOREIGN PATENT DOCUMENTS

JP 02011087086 A * 4/2011

OTHER PUBLICATIONS

Sundstrom, "Spectral Sensitivity of LINC Transmitters to Quadrature Modulator Misalignments", IEEE Transactions on Vehicular Technology, Jul. 2000, vol. 49, No. 4, pp. 1474-1487.
Casadevall et al., "Performance Analysis of QAM Modulations Applied to the LINC Transmitter", IEEE Transactions on Vehicular Technology, Nov. 1993, vol. 42, No. 4, pp. 399-406.
Poitau et al., "Experimental Characterization of LINC Outphasing Combiners' Efficiency and Linearity", IEEE Radio and Wireless Conference, 2004, pp. 87-90.
Woo et al., "SDR Transmitter Based on LINC Amplifier with Bias Control", Microwave Symposium Digest, IEEE MTT-S International, 2003, pp. 1703-1706.
Zhang et al., "Design of Linear RF Outphasing Power Amplifiers", (USA), Artech House, 2003, pp. 102.

* cited by examiner

*Primary Examiner* — David Mis
(74) *Attorney, Agent, or Firm* — Chen Yoshimura LLP

(57) ABSTRACT

Provided is a modulation apparatus that outputs an output signal having a designated amplitude and a designated phase, comprising a first variable delay section that outputs a first delayed signal obtained by delaying a periodic signal by a set delay time; a second variable delay section that outputs a second delayed signal obtained by delaying the periodic signal by a set delay time; an adding section that adds together the first delayed signal and the second delayed signal, and outputs the result as the output signal; and a setting section that sets the delay times for the first variable delay section and the second variable delay section according to the designated amplitude and the designated phase.

20 Claims, 11 Drawing Sheets

MODULATION APPARATUS AND TEST APPARATUS

BACKGROUND

1. Technical Field

The present invention relates to a modulation apparatus and a test apparatus.

2. Related Art

Conventional LINC circuits that output modulated signals are known, as shown in Non-patent Documents 1 to 5. These LINC circuits add together two periodic signals having fixed amplitudes and different phases in order to output a modulated signal with the desired amplitude and phase. These LINC circuits can output modulated signals having large amplitudes and little distortion, regardless of the linearity of the amplifiers at the output stage.

Non-patent Document 1: Lars Sundström, "Spectral Sensitivity of LINC Transmitters to Quadrature Modulator Misalignments", IEEE TRANSACTIONS ON VEHICULAR TECHNOLOGY, VOL. 49, NO. 4, JULY 2000

Non-patent Document 2: Fernando J. Casadevall and Antonio Valdovinos, "Performance Analysis of QAM Modulations Applied to the LINC Transmitter", IEEE TRANSACTIONS ON VEHICULAR TECHNOLOGY, VOL. 42, NO. 4, NOVEMBER 1993

Non-patent Document 3: Gwenael Poitau, Ahmed Birafane and Ammar Kouki, "Experimental Characterization of LINC Outphasing Combiners' Efficiency and Linearity", IEEE Radio and Wireless Conference, 2004

Non-patent Document 4: Young Yun Woo, Jaehyok Yi, Youngoo Yang, and Bumman Kim, "SDR Transmitter Based on LINC Amplifier with Bias Control", Microwave Symposium Digest, 2003 IEEE MTT-S International Non-patent Document 5: Xuejun Zhang, Lawrence E. Larson, and Peter Asbeck, "Design of Linear RF Outphasing Power Amplifiers", (USA), Artech House, 2003

However, these LINC circuits each include two orthogonal modulators for generating the two periodic signals. The orthogonal modulators are large and exhibit significant drift due to temperature and processing. Accordingly, the LINC circuits have undesirably large structures and have difficulty outputting stable and accurate modulated signals.

SUMMARY

Therefore, it is an object of an aspect of the innovations herein to provide a modulation apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary modulation apparatus may include a modulation apparatus that outputs an output signal having a designated amplitude and a designated phase, comprising a first variable delay section that outputs a first delayed signal obtained by delaying a periodic signal by a set delay time; a second variable delay section that outputs a second delayed signal obtained by delaying the periodic signal by a set delay time; an adding section that adds together the first delayed signal and the second delayed signal, and outputs the result as the output signal; and a setting section that sets the delay times for the first variable delay section and the second variable delay section according to the designated amplitude and the designated phase.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
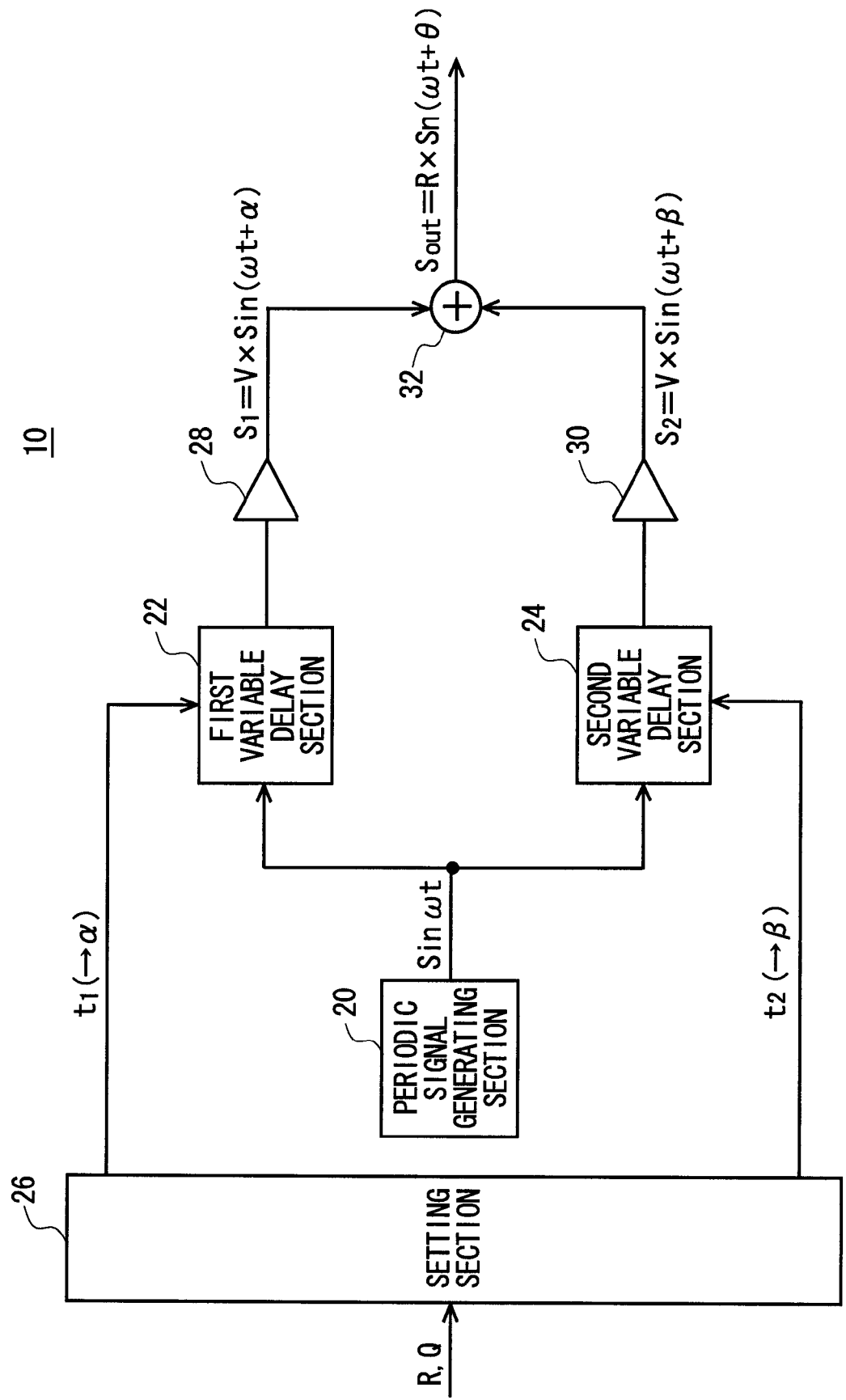
FIG. 1 shows a configuration of a modulation apparatus 10 according to an embodiment of the present invention.

FIG. 1 shows a configuration of a modulation apparatus 10 according to an embodiment of the present invention. The modulation apparatus 10 of the present embodiment receives an amplitude and phase designation from the outside and outputs an output signal having a prescribed frequency, the designated amplitude R, and the designated phase θ. The modulation apparatus 10 may be a so-called LINC (linear amplification using non-linear components) circuit, for example.

The modulation apparatus 10 includes a periodic signal generating section 20, a first variable delay section 22, a second variable delay section 24, a setting section 26, a first amplifying section 28, a second amplifying section 30, and an adding section 32. The periodic signal generating section 20 generates a periodic signal with a prescribed frequency. The periodic signal generating section 20 may generate the periodic signal as a sine-wave signal sin(Ωt) with a prescribed angular frequency Ω, for example. As another example, the periodic signal generating section 20 may generate the periodic signal to be a square-wave signal that includes the sine-wave signal sin(Ωt) with the prescribed angular frequency Ω as the primary component thereof.

The first variable delay section 22 receives the periodic signal from the periodic signal generating section 20. The first variable delay section 22 outputs a first delayed signal $S_1$ by delaying the received periodic signal by a set time.

The second variable delay section 24 receives the periodic signal from the periodic signal generating section 20. The second variable delay section 24 outputs a second delayed signal $S_2$ by delaying the received periodic signal by a set time.

The setting section 26 sets the delay times of the first variable delay section 22 and the second variable delay section 24 based on the designated amplitude R and the designated phase θ. More specifically, the setting section 26 sets the first variable delay section 22 to have a delay time $t_1$ that delays the periodic signal by a first phase α. The setting section 26 sets the second variable delay section 24 to have a delay time $t_2$ that delays the periodic signal by a second phase β.

As a result, the setting section 26 can cause the first variable delay section 22 to output a first delayed signal $S_1$ ($S_1$=sin (Ωt+α)) that is delayed from the periodic signal by the first phase α. Furthermore, the setting section 26 can cause the second variable delay section 24 to output a second delayed signal $S_2$ ($S_2$=sin(Ωt+β)) that is delayed from the periodic signal by the first phase β. The calculation of the first phase α and the second phase β is described in detail with reference to FIGS. 5 and 6.

The first amplifying section 28 amplifies the first delayed signal $S_1$ output from the first variable delay section 22 to have a predetermined prescribed amplitude V. The first amplifying section 28 then supplies the adding section 32 with the first delayed signal $S_1$ ($S_1$=V×sin Ωt+α) having the prescribed amplitude.

The second amplifying section 30 amplifies the second delayed signal $S_2$ output from the second variable delay section 24 to have the predetermined prescribed amplitude. The second amplifying section 30 then supplies the adding section 32 with the second delayed signal $S_2$ ($S_2$=V×sin Ωt+β) having the prescribed amplitude.

The adding section 32 adds together the first delayed signal with the prescribed amplitude output from the first amplifying section 28 and the second delayed signal with the prescribed amplitude output from the second amplifying section 30, and outputs the result as the output signal Sout (Sout=R× sin(Ωt+θ)). The adding section 32 can output an output signal Sout (Sout=R×sin(Ωt+θ)) having the designated amplitude R and the designated phase θ.

Figure 2:
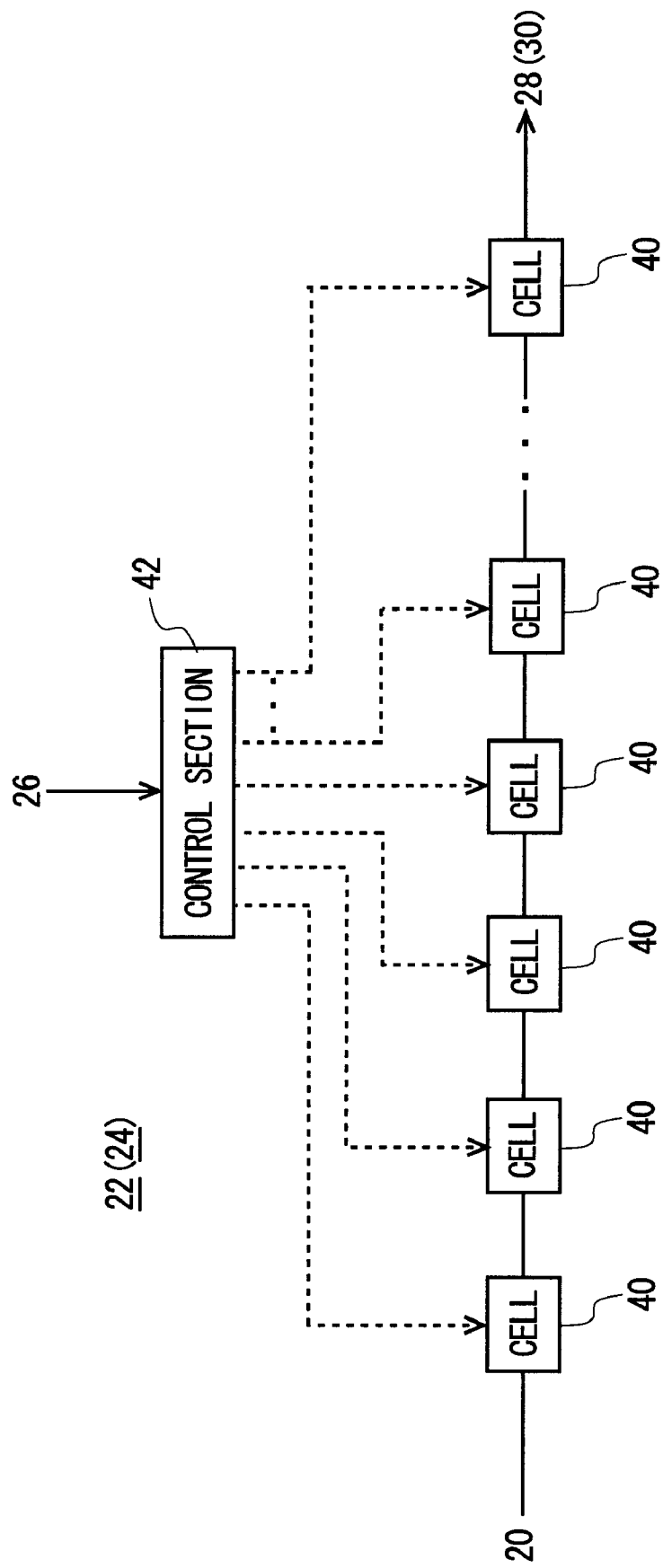
FIG. 2 shows an exemplary configuration of the first variable delay section 22 (or second variable delay section 24) according to the present embodiment.

FIG. 2 shows an exemplary configuration of the first variable delay section 22 (or second variable delay section 24) according to the present embodiment. The first variable delay section 22 and the second variable delay section 24 have the same configuration. The following is a description of the first variable delay section 22, and a separate description of the second variable delay section 24 is omitted.

The first variable delay section 22 includes a plurality of cells 40 and a control section 42. The cells 40 are connected in series. Each cell 40 delays the signal passing therethrough. Each cell 40 has a variable delay amount.

The control section 42 changes the delay amounts of the cells 40 such that the total delay time of the cells 40 connected in series becomes the delay time set by the setting section 26. The first variable delay section 22 and second variable delay section 24 configured in this way can each delay the periodic signal received from the periodic signal generating section 20 by the delay amount set by the setting section 26.

Figure 3:
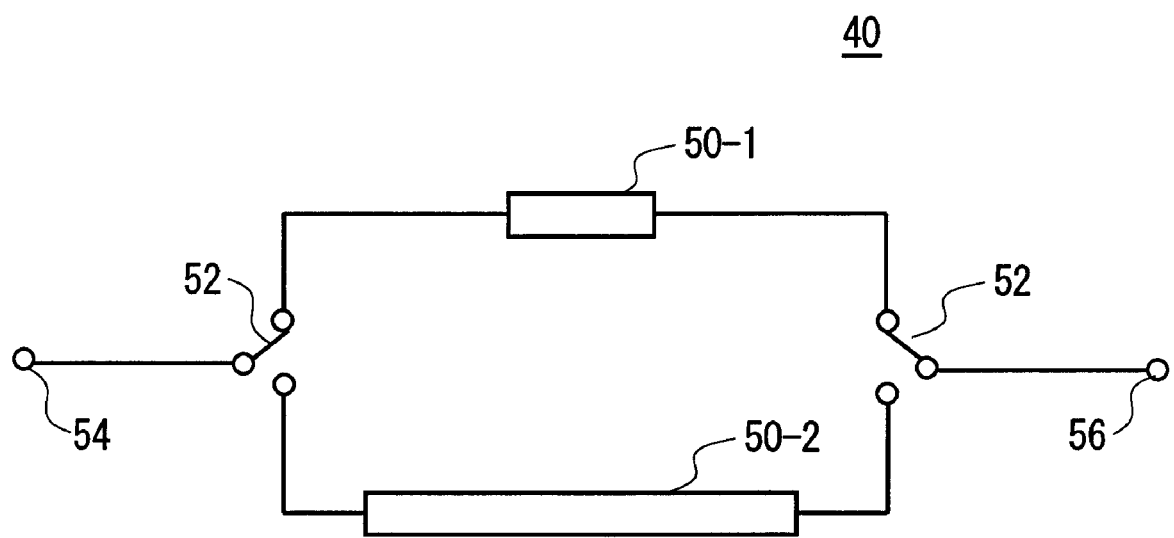
FIG. 3 shows an exemplary configuration of a cell 40 according to the present embodiment.

FIG. 3 shows an exemplary configuration of a cell 40 according to the present embodiment. The cell 40 includes a plurality of transmission lines 50 and a switching section 52. In this example, the cell 40 includes two transmission lines 50, which are the first transmission line 50-1 and the second transmission line 50-2.

The transmission lines 50 are provided in parallel between an input end and an output end of the cell 40. The transmission lines 50 each have different delay amounts.

The switching section 52 selects one of the transmission lines 50 under the control of the control section 42, and causes the signal input to the input end to be output from the output end through the selected transmission line 50. This cell 40 can change its delay amount under the control of the control section 42.

Figure 4:
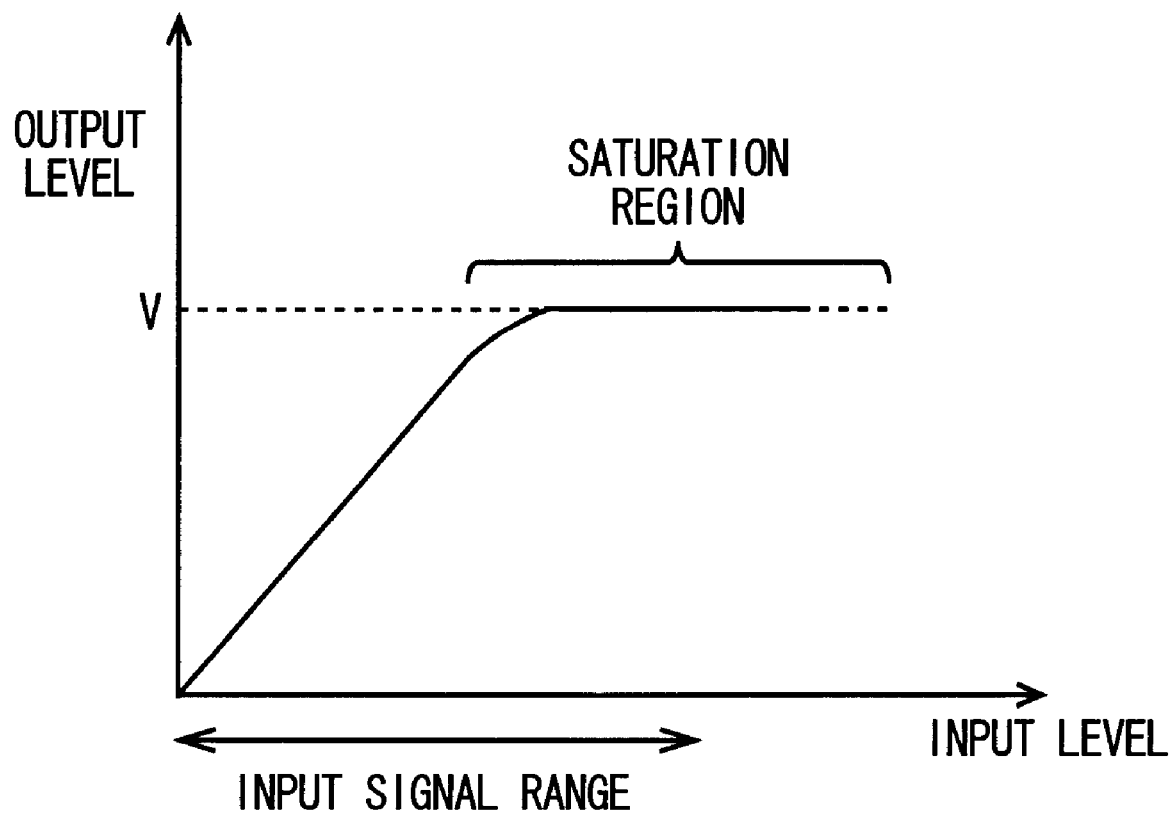
FIG. 4 shows exemplary input/output characteristics of the first amplifying section 28 and the second amplifying section 30 according to the present embodiment.

FIG. 4 shows exemplary input/output characteristics of the first amplifying section 28 and the second amplifying section 30 according to the present embodiment. The first amplifying section 28 and the second amplifying section 30 each amplify a signal with an amplification factor that causes saturation at the predetermined prescribed amplitude V.

Here, amplifying a signal to cause saturation refers to amplifying the signal in a manner to create a region in which, even when the input signal changes, the level of the output signal barely changes, i.e. the change is less than a prescribed value. The first amplifying section 28 and the second amplifying section 30 can output the first delayed signal and the second delayed signal to have the predetermined prescribed amplitude V, even if the linearity is relatively poor.

Figure 5:
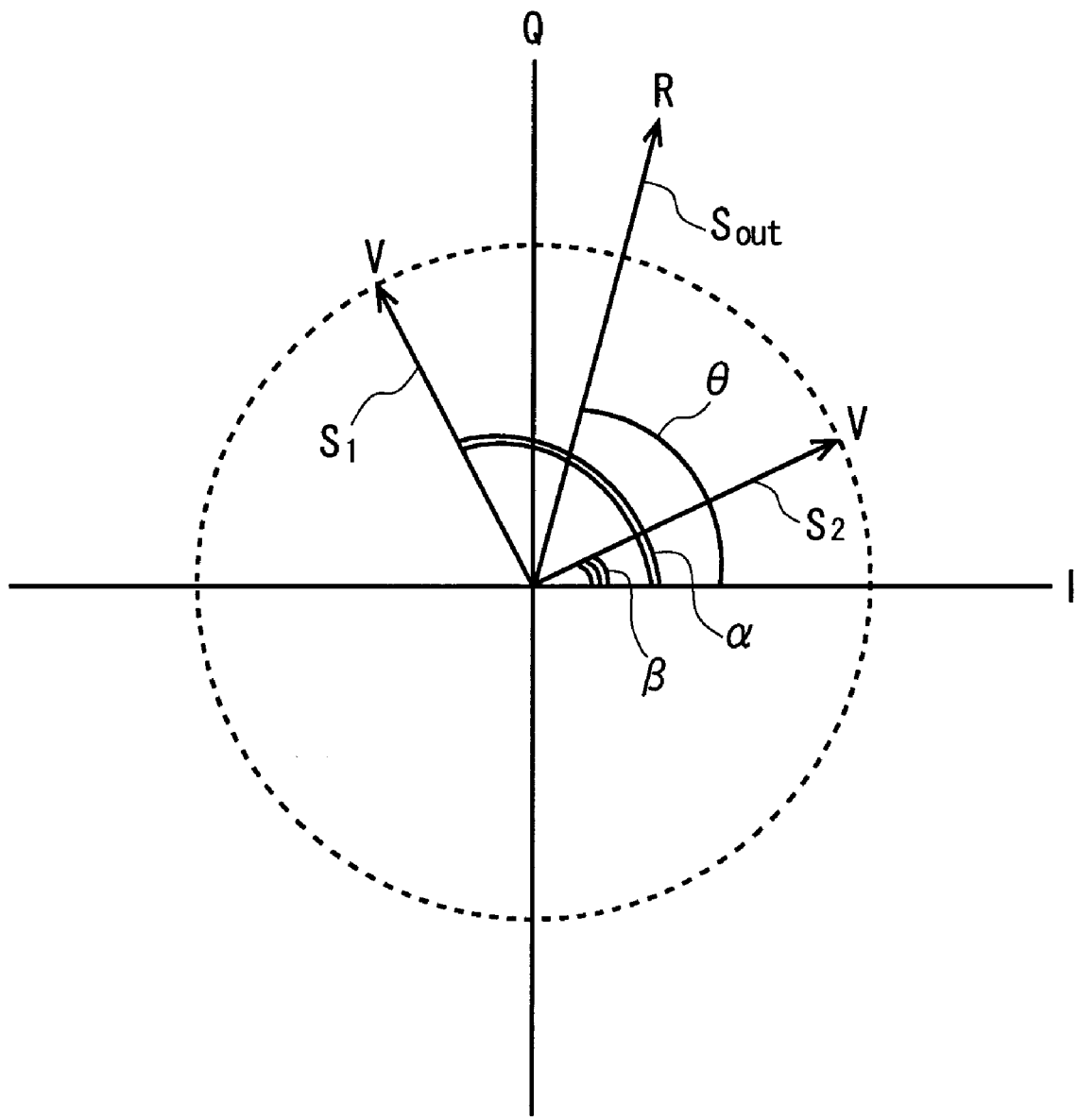
FIG. 5 shows exemplary amplitudes and phases of the output signal Sout, the first delayed signal $S_1$, and the second delayed signal $S_2$ according to the present embodiment.

FIG. 5 shows exemplary amplitudes and phases of the output signal Sout, the first delayed signal $S_1$, and the second delayed signal $S_2$ according to the present embodiment. When the phase of the periodic signal generated from the periodic signal generating section 20 is 0, the first amplifying section 28 and the second amplifying section 30 output the first delayed signal $S_1$ and the second delayed signal $S_2$ shown in FIG. 5.

In other words, the first amplifying section 28 outputs the first delayed signal $S_1$ with the amplitude V and the first phase α, and the second amplifying section 30 outputs the second delayed signal $S_2$ with the amplitude V and the second phase β.

The adding section 32 adds together the vectors of the first delayed signal $S_1$ and the second delayed signal $S_2$, and outputs the result as the output signal Sout. Specifically, the phase θ of the output signal Sout is (α+β)/2, which is the center point between the first phase α and the second phase β. Furthermore, the amplitude R of the output signal Sout is equal to the sum of the cosine component V×cos(α−((α+β)/2)) of the first delayed signal $S_1$ and cosine component V×cos(β− ((α+β)/2)) of the second delayed signal $S_2$, with the center point (α+β)/2 between the first phase α and the second phase θ as a reference.

Figure 6:
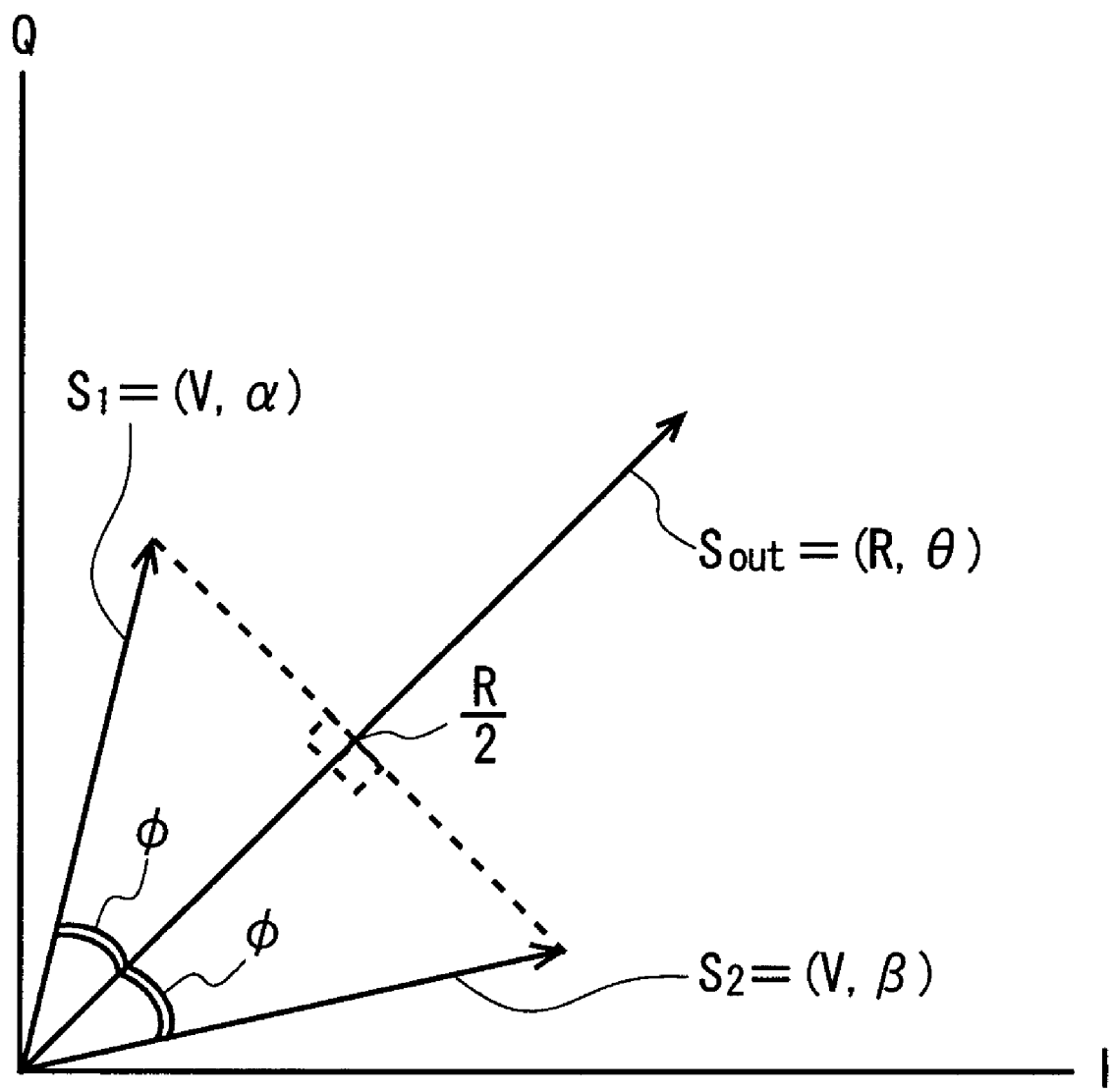
FIG. 6 shows a method for calculating the amplitudes and phases of the first delayed signal $S_1$ and the second delayed signal $S_2$ when the designated amplitude R and the designated phase θ are supplied.

FIG. 6 shows a method for calculating the amplitudes and phases of the first delayed signal $S_1$ and the second delayed signal $S_2$ when the designated amplitude R and the designated phase θ are supplied. When the designated amplitude R and the designated phase θ are supplied from the outside, the setting section 26 calculates the adjustment phase φ as shown below in Expression 1.

$$\phi = \cos^{-1}((R/2)/V) \qquad \text{Expression 1}$$

In other words, the setting section 26 calculates the adjustment phase φ to be the arccosine cos−1((R/2)/V) of the ratio of half the designated amplitude R to the predetermined prescribed amplitude V. Next, the setting section 26 calculates the first phase α as shown in Expression 2. The setting section 26 also calculates the second phase β as shown in Expression 3.

$$\alpha = \theta + \phi \quad \text{Expression 2}$$

$$\beta = \theta - \phi \quad \text{Expression 3}$$

In other words, the setting section 26 calculates the first phase α($\alpha=\theta+\phi$) by adding the adjustment phase φ to the designated phase θ. Furthermore, the setting section 26 calculates the second phase θ($\beta=\theta-\phi$) by subtracting the adjustment phase φ from the designated phase θ.

Next, the setting section 26 calculates the first delay time $t_1$ for delaying the periodic signal by the calculated first phase α. Furthermore, the setting section 26 calculates the second delay time $t_2$ for delaying the periodic signal by the calculated second phase β. If the periodic signal is a sine-wave signal with a frequency f, for example, the setting section 26 calculates the first delay time $t_1$ and the second delay time $t_2$ as shown in Expressions 4 and 5.

$$t_1 = \alpha/2\pi f \quad \text{Expression 4}$$

$$t_2 = \beta/2\pi f \quad \text{Expression 5}$$

The setting section 26 then sets the first variable delay section 22 to have the first delay time $t_1$ calculated in this manner. As a result, the first variable delay section 22 can output the first delayed signal $S_1$ delayed by the first phase α from the periodic signal. Furthermore, the setting section 26 sets the second variable delay section 24 to have the second delay time $t_2$ calculated in the above manner. As a result, the second variable delay section 24 can output the second delayed signal $S_2$ delayed by the second phase β from the periodic signal.

The adding section 32 adds together (i) the first delayed signal $S_1$ having the prescribed voltage V, the first phase α, and a prescribed frequency and (ii) the second delayed signal $S_2$ having the prescribed voltage V, the second phase β, and the prescribed frequency. The adding section 32 outputs the output signal Sout (Sout=R×sin(Ωt+θ)) having the designated amplitude R, the designated phase θ, and the prescribed frequency.

The modulation apparatus 10 according to the present embodiment can output an output signal with little distortion. Furthermore, the modulation apparatus 10 can output an output signal with a large amplitude.

By using the first variable delay section 22 and the second variable delay section 24, the size of the modulation apparatus 10 is decreased. Furthermore, the modulation apparatus 10 can decrease the drift due to temperature, processing, or the like, thereby achieving stable and accurate operation.

Figure 7:
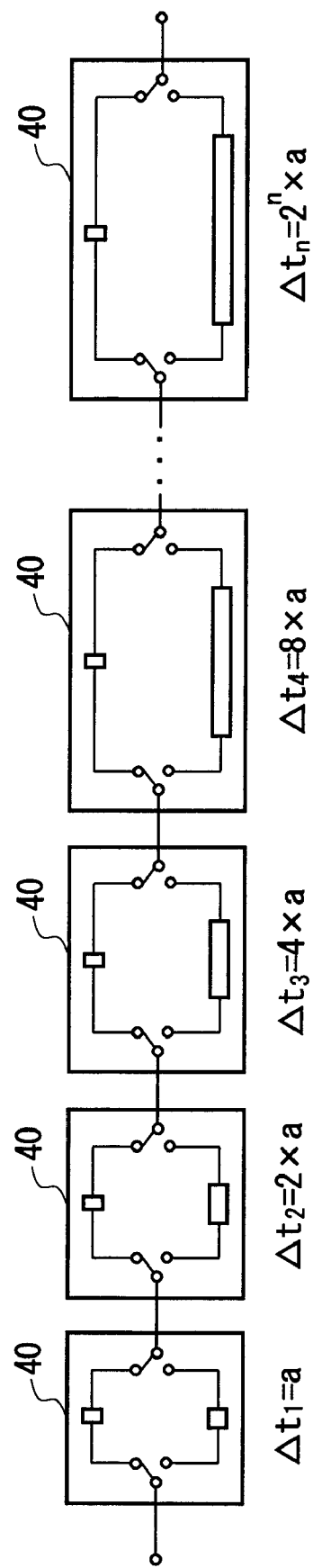
FIG. 7 shows exemplary cells 40 according to a first modification.

FIG. 7 shows exemplary cells 40 according to a first modification. The modulation apparatus 10 according to the present modification adopts substantially the same function and configuration as the modulation apparatus 10 described in FIGS. 1 to 6, and therefore components that are the same as those in FIGS. 1 to 6 are given the same reference numerals and only differing points are included in the following description.

The first variable delay section 22 and the second variable delay section 24 of the present modification each include a plurality of cells 40 that each switch between two transmission lines. The difference between the delay times of the two transmission lines 50 is different for each cell 40 of the present modification.

For example, a first cell 40 from among the plurality of cells 40 may have a time "a" as the difference $\Delta t_1$ between the delay times of the two transmission lines therein. A second cell 40 may have a time "2×a" as the difference $\Delta t_2$ between the delay times of the two transmission lines therein, a third cell 40 may have a time "4×a" as the difference $\Delta t_3$ between the delay times of the two transmission lines therein, and an n-th cell 40 may have a time "$2^n \times a$" as the difference $\Delta t_n$ between the delay times of the two transmission lines therein, where n is an integer greater than 1.

The difference in the delay time between the two transmission lines differs for each cell 40, and this difference increases by a power of 2 for each successive cell 40. If n cells 40 are provided, the first variable delay section 22 and the second variable delay section 24 having this configuration can each change among $2^n$ stages of total delay times. As a result, the modulation apparatus 10 according to the first modification can change the amplitude and the phase of the output signal among many stages.

Furthermore, the cells 40 may be designed such that the difference in the delay time between the two transmission lines in each successive cell increases by a power less than 2, such as 1.9. With this design, even when there is an error in the difference between delay times in a cell 40 having a certain weighting, the desired total delay time can be set by adding together the cell 40 with the certain weighting and a cell 40 having a smaller weighting during the calibration.

The first variable delay section 22 and the second variable delay section 24 may each further include an equalizer between any two cells 40. As a result, the first variable delay section 22 and the second variable delay section 24 can achieve accurate delays by using the equalizers to add the frequency component lost when the signal passes through the cell 40.

Figure 8:
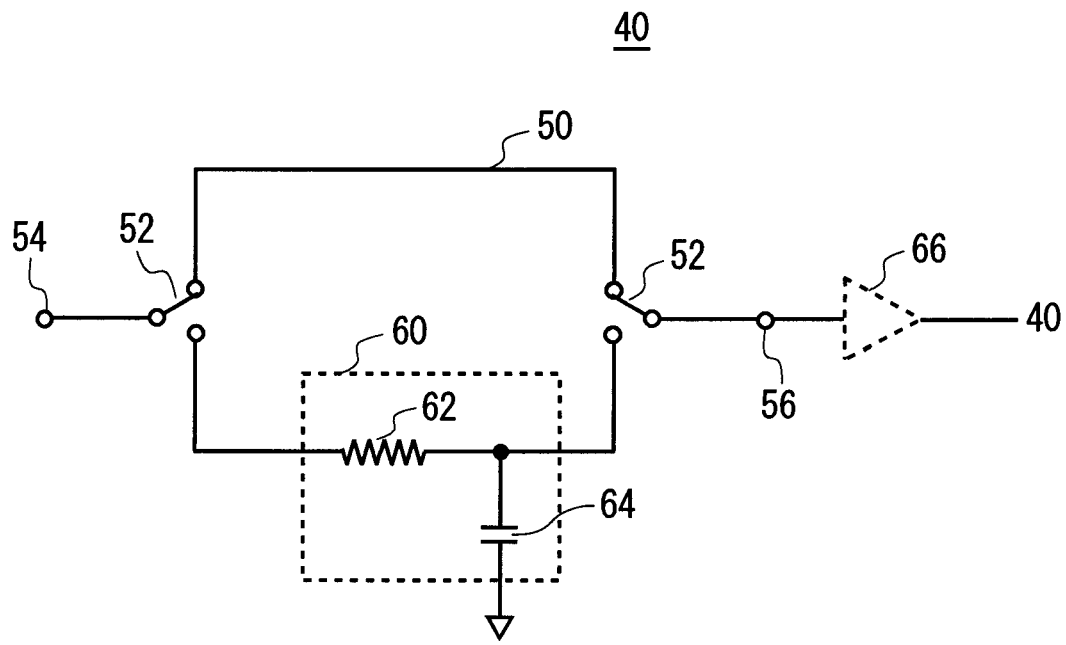
FIG. 8 shows a configuration of a cell 40 according to a second modification of the present embodiment.

FIG. 8 shows a configuration of a cell 40 according to a second modification of the present embodiment. The modulation apparatus 10 according to the present modification adopts substantially the same function and configuration as the modulation apparatus 10 described in FIGS. 1 to 6, and therefore components that are the same as those in FIGS. 1 to 6 are given the same reference numerals and only differing points are included in the following description.

Each cell 40 in the present modification includes a transmission line 50, a delay filter 60, and a switching section 52. The transmission line 50 provides a connection between the input end 54 and the output end 56 of the cell 40.

The delay filter 60 is connected in parallel with the transmission line 50 between the input end 54 and the output end 56 of the cell 40. The delay filter 60 includes a resistor 62 connected between the input end 54 and the output end 56 and a capacitor 64 connected between the output end 56 and a reference potential, such as a ground potential. This delay filter 60 functions as a filter for delaying the signal passing therethrough.

The switching section 52 selects one of the transmission line 50 and the delay filter 60, and outputs the signal input to the input end 54 from the output end 56 via the selected path. The cell 40 switches between outputting the input signal via the delay filter 60 and outputting the input signal without being delayed by the delay filter 60. Accordingly, the cell 40 can switch the delay amount of the signal passing therethrough.

When the periodic signal output by the periodic signal generating section 20 is a square-wave signal, the first variable delay section 22 and the second variable delay section 24 of the present modification may each include a driver 66 in the final-stage cell 40 therein. The driver 66 outputs logic H when the level of the signal output from the cell 40 is greater than or equal to a prescribed threshold value, and outputs logic L when this level is less than the prescribed threshold value. As a result, the driver 66 can shape a signal whose waveform is dulled by the cell 40 into a square-wave signal delayed by the prescribed delay amount.

Figure 9:
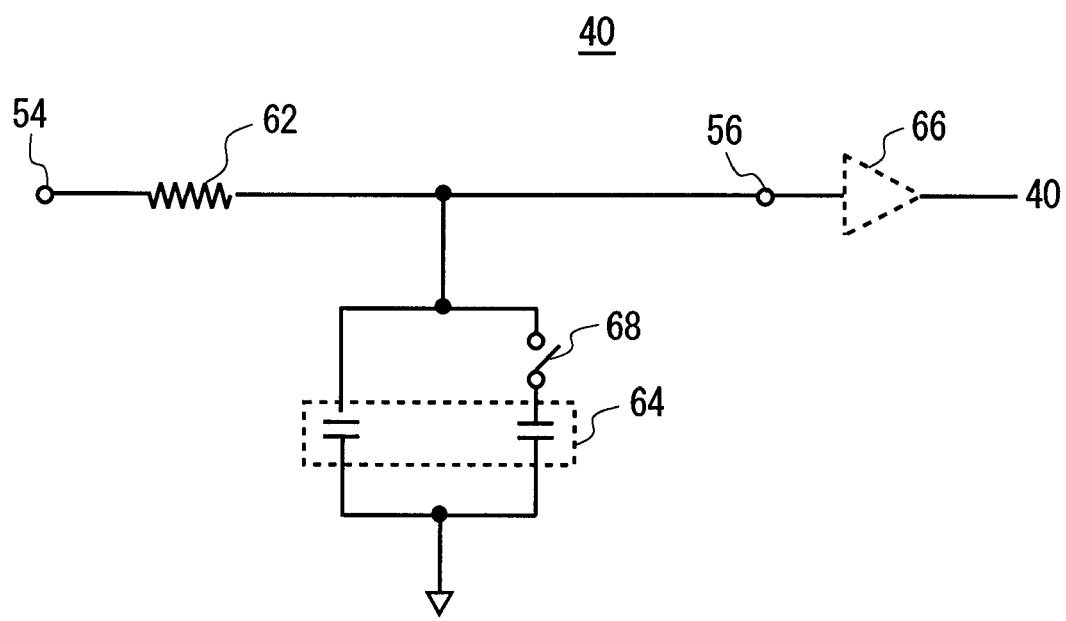
FIG. 9 shows a configuration of a cell 40 according to a third modification of the present embodiment.

FIG. 9 shows a configuration of a cell 40 according to a third modification of the present embodiment. The modulation apparatus 10 according to the present modification adopts substantially the same function and configuration as the modulation apparatus 10 described in FIGS. 1 to 6, and therefore components that are the same as those in FIGS. 1 to 6 are given the same reference numerals and only differing points are included in the following description.

Each cell 40 in the present modification includes a resistor 62, a capacitor 64, and a switching section 68. The resistor 62 is connected between the input end 54 and the output end 56. The capacitor 64 is connected between the output end 56 and the reference potential, such as the ground potential. The switching section 68 switches the capacitance of the capacitor 64.

For example, the capacitor 64 may include two capacitor elements connected in parallel between the output end 56 and the reference potential. In this case, the switching section 68 switches whether one of the capacitor elements of the capacitor 64 is connected between the output end 56 and the reference potential.

The cell 40 can switch the delay amount of the signal passing therethrough. When the periodic signal output by the periodic signal generating section 20 is a square-wave signal, the first variable delay section 22 and the second variable delay section 24 of the present modification may each include a driver 66 in the final-stage cell 40 therein, as described in the second modification of FIG. 8.

Figure 10:
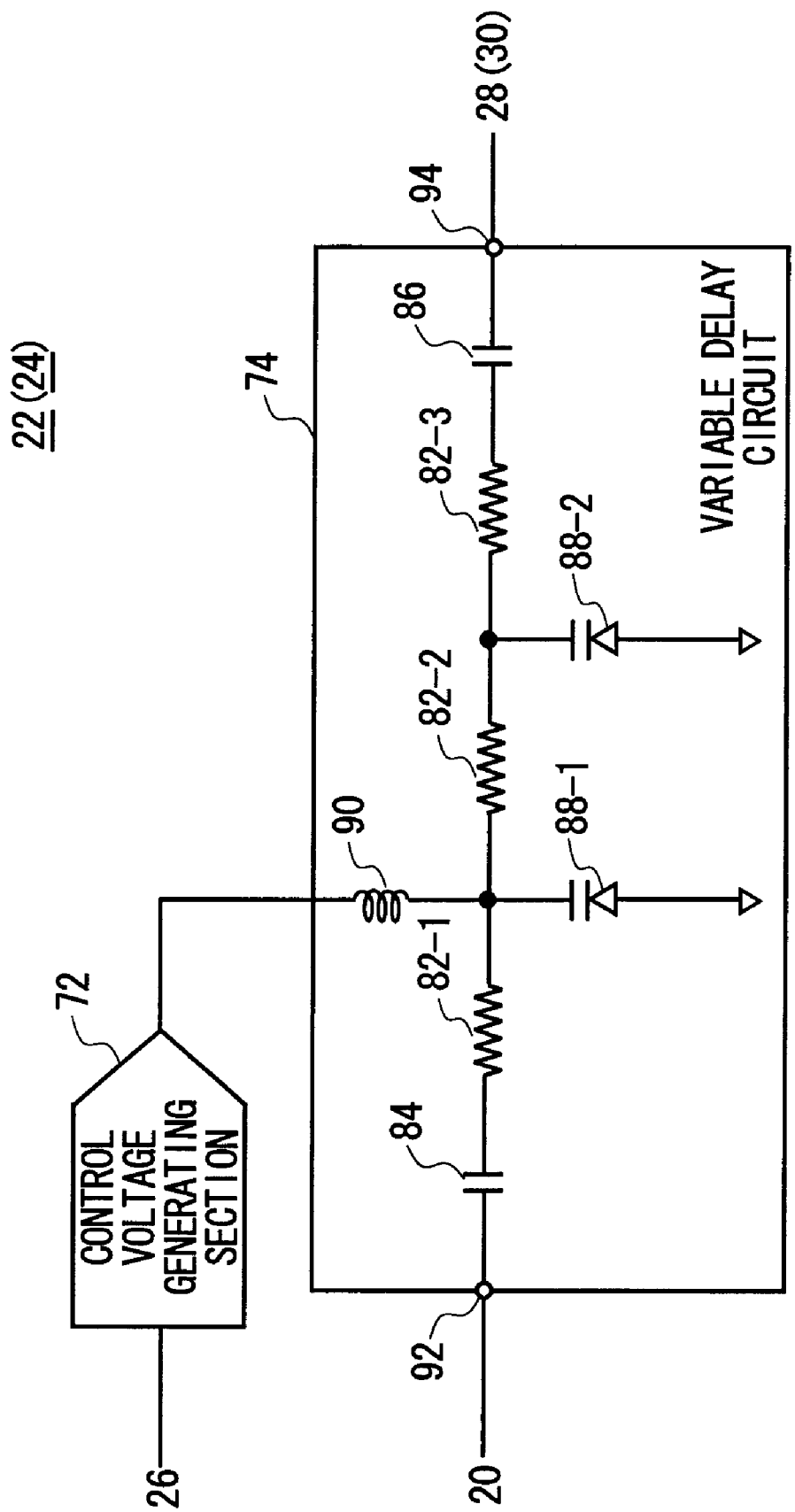
FIG. 10 shows an exemplary configuration of the first variable delay section 22 and the second variable delay section 24 according to a fourth modification of the present embodiment.

FIG. 10 shows an exemplary configuration of the first variable delay section 22 and the second variable delay section 24 according to a fourth modification of the present embodiment. The modulation apparatus 10 according to the present modification adopts substantially the same function and configuration as the modulation apparatus 10 described in FIGS. 1 to 6, and therefore components that are the same as those in FIGS. 1 to 6 are given the same reference numerals and only differing points are included in the following description.

The first variable delay section 22 and the second variable delay section 24 of the present modification each include a control voltage generating section 72 and a variable delay circuit 74. The control voltage generating section 72 generates a control voltage corresponding to the delay time set by the setting section 26. The control voltage generating section 72 may be a DA converter, for example.

The variable delay circuit 74 delays the periodic signal supplied from the periodic signal generating section 20 and outputs the resulting signal. The variable delay circuit 74 has a delay amount that changes according to the control voltage generated by the control voltage generating section 72.

The variable delay circuit 74 includes three resistors 82, an input capacitor 84, an output capacitor 86, a first variable-capacitance diode 88-1, a second variable-capacitance diode 88-2, and a coil 90, for example. The three resistors 82 are connected in series between the input end 92 and the output end 94. The three resistors 82 propagate the periodic signal input from the input end 92 to be output from the output end 94. A DC control voltage generated by the control voltage generating section 72 is applied to a connection point between a first-stage resistor 82-1 and a second-stage resistor 82-2, from among the three resistors 82.

The input capacitor 84 is inserted in the wiring between the input end 92 and the first-stage resistor 82-1, from among the three resistors 82. The input capacitor 84 eliminates the low-frequency component of the periodic signal input to the input end 92.

The output capacitor 86 is inserted in the wiring between the output end 94 and a final-stage resistor 82-3, from among the three resistors 82. The output capacitor 86 eliminates the low-frequency component that is superimposed on the periodic signal due to the propagation through the three resistors 82, and outputs the resulting signal from the output end 94.

The first variable-capacitance diode 88-1 is connected between (i) the reference potential, e.g. the ground potential, and (ii) the connection point between the first-stage resistor 82-1 and the second-stage resistor 82-2. The first variable-capacitance diode 88-1 has a capacitance that changes according to the DC potential of the connection point between the first-stage resistor 82-1 and the second-stage resistor 82-2

The second variable-capacitance diode 88-2 is connected between (i) the reference potential and (ii) the connection point between the second-stage resistor 82-1 and the final-stage resistor 82-3. The second variable-capacitance diode 88-2 has a capacitance that changes according to the DC potential of the connection point between the second-stage resistor 82-1 and the final-stage resistor 82-3.

The coil 90 is inserted in the wiring between (i) the control voltage generating section 72 and (ii) the connection point between the first-stage resistor 82-1 and the second-stage resistor 82-2. The coil 90 prevents the periodic signal component propagated from the input end 92 to the output end 94 from flowing to the control voltage generating section 72.

In the variable delay circuit 74, the capacitances of the first variable-capacitance diode 88-1 and the second variable-capacitance diode 88-2 change according to the control voltage generated by the control voltage generating section 72. Therefore, the variable delay circuit 74 can delay the periodic signal by a delay amount corresponding to the control voltage generated by the control voltage generating section 72. The variable delay circuit 74 is not limited to this configuration, and may have other configurations using variable-capacitance diodes 88.

Figure 11:
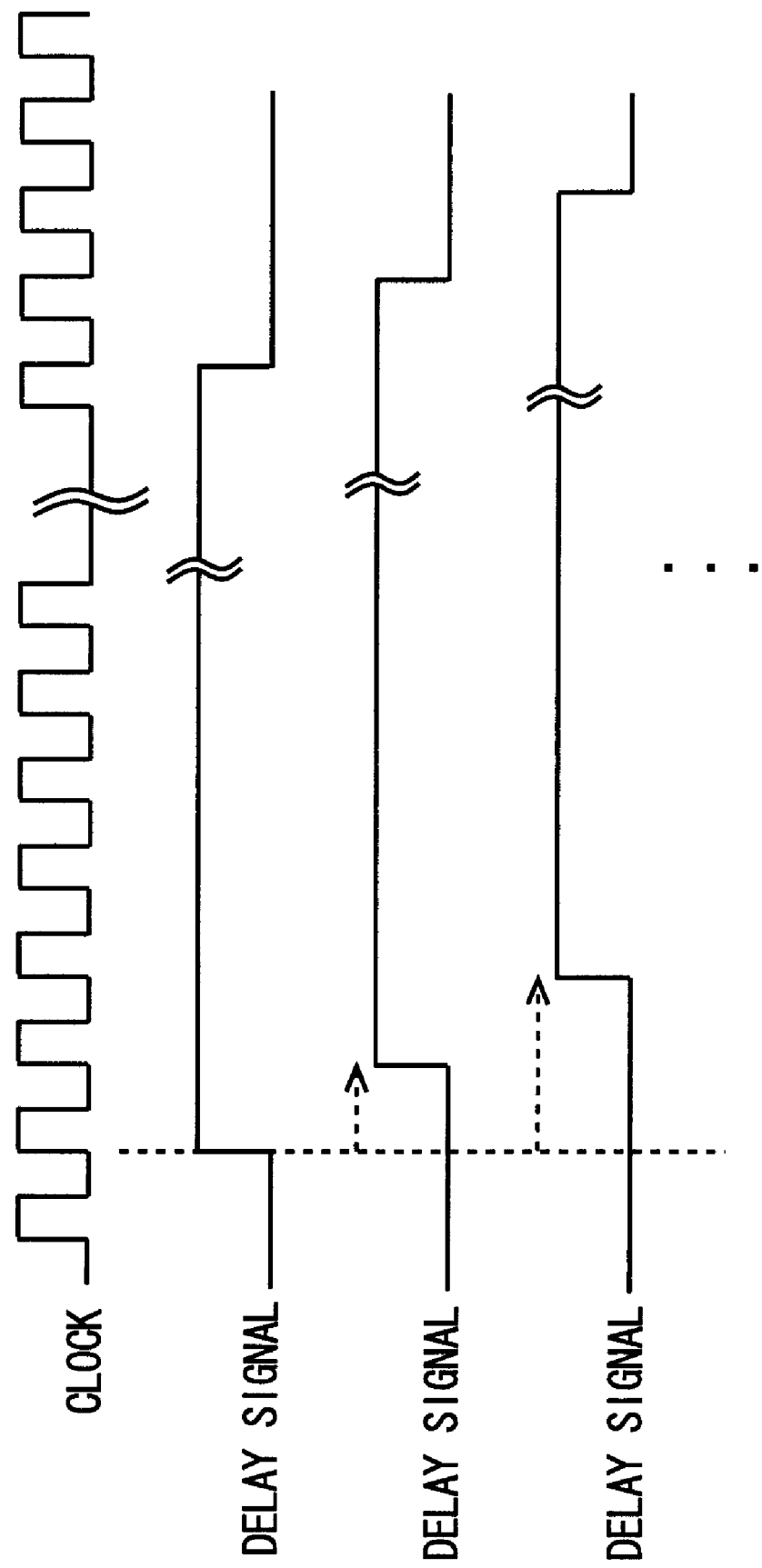
FIG. 11 shows exemplary delay signals according to a fifth modification of the present embodiment.

FIG. 11 shows exemplary delay signals according to a fifth modification of the present embodiment. The modulation apparatus 10 according to the present modification adopts substantially the same function and configuration as the modulation apparatus 10 described in FIGS. 1 to 6, and therefore components that are the same as those in FIGS. 1 to 6 are given the same reference numerals and only differing points are included in the following description.

In the present modification, the periodic signal generating section 20 generates a clock with a higher frequency than the periodic signal. For example, the periodic signal generating section 20 may generate a clock whose frequency is M times that of the periodic signal, where M is an integer greater than 1.

In the present modification, the first variable delay section 22 and the second variable delay section 24 each output a signal that is obtained by dividing the clock generated by the periodic signal generating section 20 to have the same frequency as the periodic signal and that is delayed relative to the periodic signal by a number of clocks corresponding to the set delay time.

The first variable delay section 22 and the second variable delay section 24 may each include a divider that divides the clock to have the same frequency as the periodic signal and a control section that changes the division start point of the divider according to the delay time supplied thereto. The modulation apparatus 10 of the present modification can modulate a periodic signal with a relatively low frequency.

Figure 12:
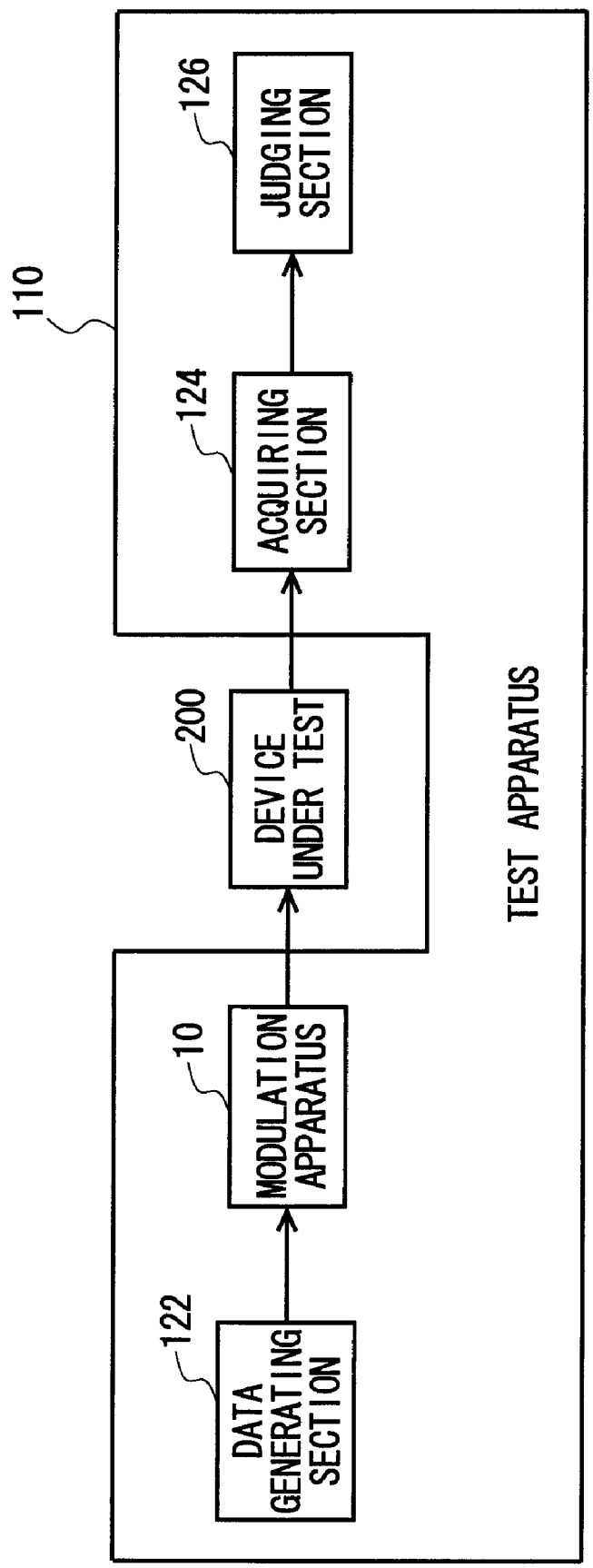
FIG. 12 shows a configuration of a test apparatus 110 according to an embodiment of the present invention.

FIG. 12 shows a configuration of a test apparatus 110 according to an embodiment of the present invention. The test apparatus 110 of the present embodiment tests a device under test 200 by supplying a modulated signal thereto.

The test apparatus 110 includes a data generating section 122, a modulation apparatus 10, an acquiring section 124, and a judging section 126. The data generating section 122 designates an amplitude and phase of the modulated signal to be supplied to the device under test 200.

The modulation apparatus 10 supplies the device under test 200 with a modulated signal corresponding to the amplitude and phase designated by the data generating section 122. The modulation apparatus 10 is the modulation apparatus 10 described in FIGS. 1 to 11, and therefore a detailed description is not provided here.

The acquiring section 124 acquires a signal output by the device under test 200 in response to the supplied modulated signal. The judging section 126 judges acceptability of the device under test 200 based on the signal acquired by the acquiring section 124.

The test apparatus 110 of the present embodiment uses the modulation apparatus 10 to generate the modulated signal supplied to the device under test 200, and can therefore have a small structure. Furthermore, the test apparatus 110 can accurately and stably test the device under test 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A modulation apparatus that outputs an output signal having a designated amplitude and a designated phase, comprising:
    a first variable delay section that outputs a first delayed signal obtained by delaying a periodic signal by a set first delay time;
    a second variable delay section that outputs a second delayed signal obtained by delaying the periodic signal by a set second delay time;
    an adding section that adds together the first delayed signal and the second delayed signal, and outputs the result as the output signal; and
    a setting section that sets the first delay time for the first variable delay section and the second delay time for the second variable delay section according to the designated amplitude and the designated phase.

2. The modulation apparatus according to claim 1, wherein the first delay time delays the periodic signal by a first phase amount, which is acquired by adding an adjustment phase to the designated phase, and the second delay time delays the periodic signal by a second phase amount, which is acquired by subtracting the adjustment phase from the designated phase.

3. The modulation apparatus according to claim 2, further comprising:
    a first amplifying section that amplifies the first delayed signal to have a predetermined prescribed amplitude and supplies the amplified first delayed signal to the adding section; and
    a second amplifying section that amplifies the second delayed signal to have the prescribed amplitude and supplies the amplified second delayed signal to the adding section, wherein
    the first delay time and the second delay time are calculated using, as the adjustment phase, an arccosine of a ratio of one half the designated amplitude to the prescribed amplitude.

4. The modulation apparatus according to claim 3, wherein the first amplifying section and the second amplifying section each perform amplification with an amplification factor that causes saturation at a predetermined prescribed amplitude.

5. The modulation apparatus according to claim 1, wherein the first variable delay section and the second variable delay section each include:
    a plurality of cells that have switchable delay amounts and that are arranged in series; and
    a control section that switches the delay amount of each cell such that a total delay time of the cells connected in series becomes the delay time set by the setting section.

6. The modulation apparatus according to claim 5, wherein the cells each include:
    a plurality of transmission lines that are provided in parallel between an input end and an output end and that have different delay amounts from each other; and
    a switching section that selects one of the transmission lines through which to output, from the output end, a signal input to the input end.

7. The modulation apparatus according to claim 5, wherein the cells each include:
    a transmission line connected between an input end and an output end;
    a delay filter that is connected between the input end and the output end and that includes a resistor and a capacitor; and
    a switching section that selects one of the transmission line and the delay filter through which to output, from the output end, a signal input to the input end.

8. The modulation apparatus according to claim 5, wherein the cells each include:
    a resistor connected between an input end and an output end;
    a capacitor connected between the output end and a reference potential; and
    a switching section that switches capacitance of the capacitor.

9. The modulation apparatus according to claim 1, wherein the first variable delay section includes:
    a first control voltage generating section that generates a first control voltage corresponding to the first delay time set by the setting section; and
    a first variable delay circuit having a delay amount that changes according to the first control voltage, and
    the second variable delay section; includes:

a second control voltage generating section that generates a second control voltage corresponding to the second delay time set by the setting section; and a second variable delay circuit having a delay amount that changes according to the second control voltage.

10. The modulation apparatus according to claim 1, wherein the first variable delay section outputs a signal that (i) is obtained by dividing a clock whose frequency is higher than that of the periodic signal to have the same frequency as the periodic signal and that (ii) is delayed relative to the periodic signal by a number of clocks corresponding to the set first delay time, and the second variable delay section outputs a signal that (i) is obtained by dividing a clock whose frequency is higher than that of the periodic signal to have the same frequency as the periodic signal and that (ii) is delayed relative to the periodic signal by a number of clocks corresponding to the set second delay time.

11. A test apparatus that supplies a device under test with a modulated signal to test the device under test, the test apparatus comprising:

a data generating section that designates an amplitude and a phase of the modulated signal;

the modulation apparatus according to claim 1 that supplies the device under test with the modulated signal corresponding to the amplitude and the phase generated by the data generating section;

an acquiring section that acquires a signal output by the device under test in response to the modulated signal; and a judging section that judges acceptability of the device under test based on the signal acquired by the acquiring section.

12. The test apparatus according to claim 11, wherein the first delay time delays the periodic signal by a first phase amount, which is acquired by adding an adjustment phase to the designated phase, and the second delay time delays the periodic signal by a second phase amount, which is acquired by subtracting the adjustment phase from the designated phase.

13. The test apparatus according to claim 12, wherein the modulation apparatus further comprises:

a first amplifying section that amplifies the first delayed signal to have a predetermined prescribed amplitude and supplies the amplified first delayed signal to the adding section; and a second amplifying section that amplifies the second delayed signal to have the prescribed amplitude and supplies the amplified second delayed signal to the adding section, wherein the first delay time and the second delay time are calculated using, as the adjustment phase, an arccosine of a ratio of one half the designated amplitude to the prescribed amplitude.

14. The test apparatus according to claim 13, wherein the first amplifying section and the second amplifying section each perform amplification with an amplification factor that causes saturation at a predetermined prescribed amplitude.

15. The test apparatus according to claim 11, wherein the first variable delay section and the second variable delay section each include:

a plurality of cells that have switchable delay amounts and that are arranged in series; and a control section that switches the delay amount of each cell such that a total delay time of the cells connected in series becomes the delay time set by the setting section.

16. The test apparatus according to claim 15, wherein the cells each include:

a plurality of transmission lines that are provided in parallel between an input end and an output end and that have different delay amounts from each other; and a switching section that selects one of the transmission lines through which to output, from the output end, a signal input to the input end.

17. The test apparatus according to claim 15, wherein the cells each include:

a transmission line connected between an input end and an output end;

a delay filter that is connected between the input end and the output end and that includes a resistor and a capacitor; and a switching section that selects one of the transmission line and the delay filter through which to output, from the output end, a signal input to the input end.

18. The test apparatus according to claim 15, wherein the cells each include:

a resistor connected between an input end and an output end;

a capacitor connected between the output end and a reference potential; and a switching section that switches capacitance of the capacitor.

19. The test apparatus according to claim 11, wherein the first variable delay section includes:

a first control voltage generating section that generates a first control voltage corresponding to the first delay time set by the setting section; and a first variable delay circuit having a delay amount that changes according to the first control voltage, and the second variable delay section includes:

a second control voltage generating section that generates a second control voltage corresponding to the second delay time set by the setting section; and a second variable delay circuit having a delay amount that changes according to the second control voltage.

20. The modulation apparatus according to claim 11, wherein the first variable delay section outputs a signal that (i) is obtained by dividing a clock whose frequency is higher than that of the periodic signal to have the same frequency as the periodic signal and that (ii) is delayed relative to the periodic signal by a number of clocks corresponding to the set first delay time, and the second variable delay section outputs a signal that (i) is obtained by dividing a clock whose frequency is higher than that of the periodic signal to have the same frequency as the periodic signal and that (ii) is delayed relative to the periodic signal by a number of clocks corresponding to the set second delay time.

* * * * *